US011599300B2

(12) United States Patent
Yeung et al.

(10) Patent No.: US 11,599,300 B2
(45) Date of Patent: Mar. 7, 2023

(54) VOLTAGE THRESHOLD PREDICTION-BASED MEMORY MANAGEMENT

(71) Applicant: Micron Technology, Inc., Boise, ID (US)

(72) Inventors: Chun Sum Yeung, San Jose, CA (US); Guang Hu, Mountain View, CA (US); Ting Luo, Santa Clara, CA (US); Tao Liu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/234,095

(22) Filed: Apr. 19, 2021

(65) Prior Publication Data

US 2022/0334753 A1 Oct. 20, 2022

(51) Int. Cl.
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 10,223,028 B2 * | 3/2019 | Gorobets | G11C 16/349 |
| 2014/0143630 A1 * | 5/2014 | Mu | G11C 29/50004 714/763 |
| 2014/0231954 A1 | 8/2014 | Lue | |
| 2014/0245089 A1 * | 8/2014 | Kurosawa | G11C 29/021 714/721 |
| 2015/0309856 A1 * | 10/2015 | Weilemann, II | G06F 11/073 714/47.3 |
| 2015/0332777 A1 * | 11/2015 | Yoon | G11C 11/5642 365/185.12 |
| 2016/0179386 A1 | 6/2016 | Zhang | |
| 2018/0076829 A1 * | 3/2018 | Ueki | G06F 11/073 |
| 2018/0240518 A1 * | 8/2018 | Hung | G06F 11/108 |

FOREIGN PATENT DOCUMENTS

| | | | |
|---|---|---|---|
| CN | 110720088 A * | 1/2020 | G06F 11/1435 |
| WO | 2017074570 A1 | 5/2017 | |

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

* cited by examiner

*Primary Examiner* — Sanjiv Shah
*Assistant Examiner* — Elias Young Kim
(74) *Attorney, Agent, or Firm* — Brooks, Cameron & Huebsch, PLLC

(57) ABSTRACT

A method includes performing a first read operation involving a set of memory cells using a first voltage, determining a quantity of bits associated with the set of memory cells based on the first read operation, performing a second read operation involving the set of memory cells using a second voltage that is greater than the first voltage when the quantity of bits is above a threshold quantity of bits for the set of memory cells, and performing the second read operation involving the set of memory cells using a third voltage that is less than the first voltage when the quantity of bits is below the threshold quantity of bits for the set of memory cells.

20 Claims, 5 Drawing Sheets

VOLTAGE THRESHOLD PREDICTION-BASED MEMORY MANAGEMENT

TECHNICAL FIELD

Embodiments of the disclosure relate generally to memory sub-systems, and more specifically, relate to voltage threshold prediction-based memory management.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
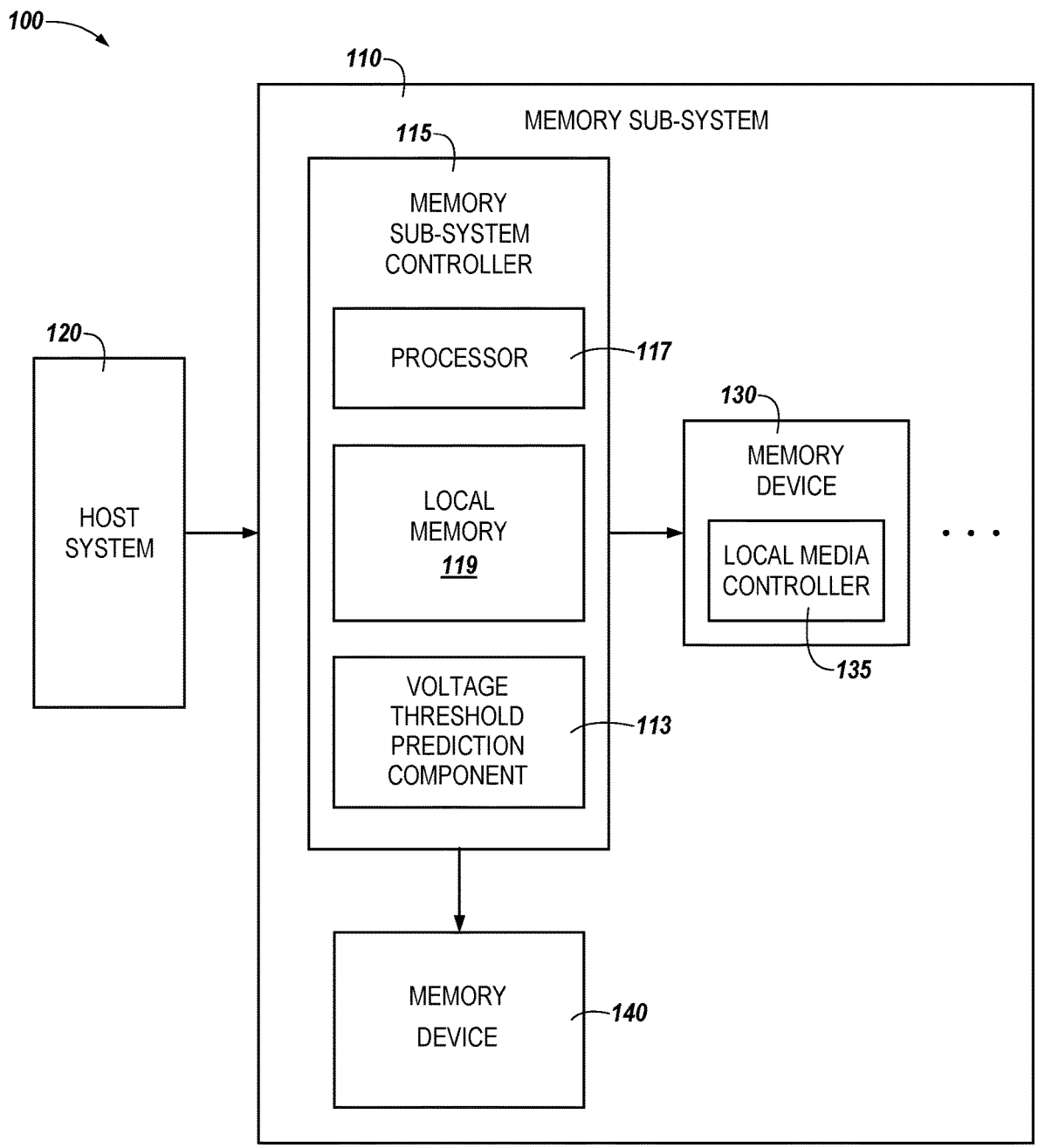
FIG. 1 illustrates an example computing system that includes a memory sub-system in accordance with some embodiments of the present disclosure.

Aspects of the present disclosure are directed to error recovery operations in a memory sub-system, in particular to memory sub-systems that include a voltage threshold prediction component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

During operation, a memory sub-system can incur errors that can affect the quality and/or accuracy of data written to and stored by the memory sub-system. Such errors can include loss or gain of charge associated with a storage cell, read disturbances, write disturbances, and/or degradation of data quality/cell quality as a result of the quantity of program/erase cycles the cell has been subjected to. As the memory sub-system ages, such errors can become increasingly difficult to correct and/or mitigate, especially in mobile computing system architectures in which an amount of physical space available for hardware components can be limited. In addition, these errors can become more pronounced and/or more frequent over time (e.g., as the memory sub-system ages), which can further impact the quality and/or accuracy of data written to and stored by the memory sub-system. Moreover, such errors can become more difficult to mitigate and/or correct at edge cases, such as when the memory sub-system is experiencing a stress condition, such as various end-of-life (EOL) testing operations where the memory sub-system is exposed to frequent and/or rigorous testing to ensure that the memory sub-system can operate.

Some approaches attempt to mitigate the types of errors described above by performing a series (or at least a portion of a series) of error handling processing (e.g., read error handling (REH) processes) to correct such errors and/or determine if correction of such errors was successful. Such approaches can perform different operations in succession as part of performing the series of error handling processes to determine which, if any of such operations can remedy the detected errors. As an example, some approaches can attempt to read a memory cell with various retry voltage offsets. For example, some approaches can identify a particular parameter that includes a threshold voltage for a set of memory cells (e.g., a word line, a portion of a word line, etc.). In this example, the various retry voltage offsets can include assertion of voltages that are greater than the threshold voltage and voltages that are less than the threshold voltage ($V_T$) in an oscillating fashion. For example, in a memory access operation, a voltage that is greater than $V_T$ can be asserted followed by assertion of a voltage that is less than $V_T$, then a voltage that is greater than the previous voltage that was greater than $V_T$ can be asserted followed by assertion of a voltage that is less than the previous voltage that was less than $V_T$, etc. In this way, some approaches seek to utilize various retry voltage offsets to identify if the threshold voltage for the set of memory cells has moved. However, such approaches can be time consuming and computing resource intensive.

For example, in some approaches, each of the various retry voltage offsets can be attempted to determine if one of the various retry voltage offsets allow the set of memory cells to be decoded. This can be an intensive process in terms of computing resources since some approaches use both voltage offsets that are greater than and less than the voltage threshold for the set of memory cells are utilized to test the set of memory cells haphazardly and with no regard to the inherent behavior of the memory cells. As a result, in such approaches, testing the various retry voltage offsets can be expensive in terms of both time and computing resources to perform.

Aspects of the present disclosure address the above and other deficiencies by predicting the movement of the threshold voltage ($V_T$) based on a memory access operation (e.g. a read or write operation) involving the set of memory cells. In some embodiments, a quantity of bits stored by, or written to, the set of memory cells can be determined when utilizing the threshold voltage. As a result, a quantity of bits that fall above or below the applied $V_T$ can be determined and predictions can be made based on the behavior of the set of memory cells over time when the $V_T$ is asserted to the same. As will be appreciated, the threshold voltage for the set of memory cells can correspond to a particular read level for the set of memory cells. As used herein, a "read level" generally refers to a particular voltage applied to one or more memory cells to perform a memory access involving a physical location of a memory device. In this way, an applied read or write voltage can be used to predict a quantity of bits that exhibit voltage drift characteristics (e.g., a quantity of bits associated with a word line that have experienced temporal or other voltage-based degradation, etc.) relative to the threshold voltage. This information can be utilized to determine a threshold quantity of bits that have experienced an access voltage drift such that a prediction as to whether a threshold voltage to be applied to one or more of the set of memory cells has moved in a positive (e.g., an access voltage greater than an initial $V_T$) or negative (e.g., an access voltage less that the initial $V_T$) direction.

In some embodiments, a $V_T$ can correspond to a particular voltage within a voltage distribution associated with the set of memory cells that corresponds to a valley within the $V_T$ distribution that, when applied to a particular memory cell or the set of memory cells, returns an accurate data value stored by the memory cell or set of memory cells. As described herein, the charge stored by the memory cell or set of memory cells can "drift" (e.g., shift) over time. When a previous Vt has changed over time, a memory access operation performed using the previous $V_T$ can be associated with a voltage that no longer falls within the valley of the $V_T$ distribution. In this way, a failure can occur, or inaccurate data can be returned when the previous $V_T$ is applied to a particular memory cell or set of memory cells. For example, a read voltage for the previous $V_T$ that has "drifted" may not be an optimized read level (e.g., may not be a valley of the $V_T$ distribution) for the particular memory cell or set of memory cells. Accordingly, embodiments described herein can seek to optimize read voltages for subsequent read operations such that the subsequent read operations are performed using a $V_T$ that falls within a valley of the voltage distribution after the charge stored by the memory cells or set of memory cells has experienced a voltage drift.

Aspects of the present disclosure address the above and other deficiencies by allowing for a decrease in a quantity of offsets that can be tested in performance of memory cell decoding. For example, by performing the operations described herein, memory sub-system performance can be improved in comparison to the approaches described above since fewer offsets can be tested to determine a voltage that is capable of decoding the set of memory cells. In some embodiments, half of the offsets may be utilized to identify a voltage threshold that decodes the set of memory cells. For example, instead of utilizing both positive and negative retry voltage offsets to determine if the voltage threshold for the set of memory cells has moved in a positive or negative direction, the present approach can limit the offsets to either all positive offsets or all negative offsets based on a comparison between the threshold quantity of bits and the determined quantity of bits successfully (or unsuccessfully) decoded using a particular $V_T$ from a read or write operation. In some embodiments, the prediction of the movement of the threshold voltage can be accomplished with one single level read operation (e.g., assertion of a signal corresponding to a single $V_T$) of the set of memory cells. In this way, offsets that are opposite to the movement of a voltage indicative of an accurate read or write of the set of memory cells (or constituent memory cells contained within the set of memory cells) may not have to be tested and therefore performance of the error recovery operation can be improved.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random-access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell.

In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a voltage threshold prediction component 113. Although not shown in FIG. 1 so as to not obfuscate the drawings, the voltage threshold prediction-based memory management component 113 can include various circuitry to facilitate determining a quantity of bits associated with the set of memory cells based on the first read operation and performing a second read operation based on the determined quantity of bits. In some embodiments, the voltage threshold prediction-based memory management component 113 can include special purpose circuitry in the form of an ASIC, FPGA, state machine, and/or other logic circuitry that can allow the voltage threshold prediction-based memory management component 113 to orchestrate and/or perform operations to selectively perform media management operations (e.g., to determine $V_T$ drift) for the memory device 130 and/or the memory device 140 based at least on the quantity of programmed bits in the set of memory cells.

In some embodiments, the memory sub-system controller 115 includes at least a portion of the voltage threshold prediction-based memory management component 113. For example, the memory sub-system controller 115 can include a processor 117 (processing device) configured to execute instructions stored in local memory 119 for performing the operations described herein. In some embodiments, the voltage threshold prediction-based memory management component 113 is part of the memory sub-system 110, an application, or an operating system.

In a non-limiting example, an apparatus (e.g., the computing system 100) can include a memory sub-system voltage threshold prediction-based memory management component 113. The memory sub-system voltage threshold prediction-based memory management component 113 can be resident on the memory sub-system 110. As used herein, the term "resident on" refers to something that is physically located on a particular component. For example, the memory sub-system voltage threshold prediction-based memory management component 113 being "resident on" the memory sub-system 110 refers to a condition in which the hardware circuitry that comprises the memory sub-system voltage threshold prediction-based memory management component 113 is physically located on the memory sub-system 110. The term "resident on" may be used interchangeably with other terms such as "deployed on" or "located on," herein.

The memory sub-system voltage threshold prediction-based memory management component 113 can perform (or cause performance of) a first read operation involving a set of memory cells using a first threshold voltage that targets a particular memory cell from the set of memory cells. In some example, the set of memory cells comprise a word line of a NAND memory device. In some embodiments, the first read operation can be a single level cell (SLC) read operation of the word line of the NAND memory device. The first read operation involving the set of memory cells can utilize an identified voltage threshold assigned to the set of memory cells. For example, the voltage threshold can be a parameter for the set of memory cells. In some embodiments, the first read operation can be performed utilizing the first voltage that corresponds to a first read level for the set of memory cells. For example, the threshold voltage can be a voltage that targets a particular physical location of the set of memory cells. In this example, the read level can be the particular physical location of the set of memory cells that is targeted by the threshold voltage.

The memory sub-system voltage threshold prediction-based memory management component 113 can determine (or cause a determination to be made regarding) a quantity of bits of the set of memory cells based on the first read operation using the first threshold voltage. As used herein, a "quantity of bits" generally refers to a counted number of binary information stored by the set or portion of the set of memory cells. In some embodiments, the quantity of bits associated with the set of memory cells can be a portion of a total number of bits associated with the set of memory cells. For example, the first voltage can be a voltage that targets a physical location of a particular memory cell that corresponds to a particular bit or bits of the memory cell. In this example, a first portion of the set of memory cells can be positioned on a first side of the particular memory cell and a second portion of the set of memory cells can be positioned on a second side of the particular memory cell. In this example, the quantity of bits can be determined by reading the first portion or the second portion of the set of memory cells. As described further herein, a threshold quantity of bits successfully (or unsuccessfully) decoded can be determined based on the first voltage and whether the first portion or the second portion of the set of memory cells are read by the first read operation. As used herein, a "threshold," such as a threshold quantity of bits, generally refers to a designated quantity of programmed bits within a portion of the set of memory cells.

The memory sub-system voltage threshold prediction-based memory management component 113 can be configured to determine a first threshold quantity of bits for the set of memory cells based on the threshold voltage ($V_T$). In some embodiments, the first threshold quantity of bits for the set of memory cells can include an upper threshold quantity of bits for the set of memory cells. For example, the first threshold quantity of bits can be a threshold that when exceeded by the determined quantity of bits can indicate that the threshold voltage for the set of memory cells has moved in a particular direction and thus more bits were read than predicted.

The memory sub-system voltage threshold prediction-based memory management component 113 can be configured to determine a second threshold quantity of bits for the set of memory cells based on the threshold voltage. In some embodiments, the second threshold quantity of bits for the set of memory cells can include a lower threshold quantity of bits for the set of memory cells. For example, the second threshold quantity of bits can be a threshold that when not exceeded by the determined quantity of bits can indicate that the threshold voltage for the set of memory cells has moved in a particular direction and thus fewer bits were read than predicted.

As described herein, the movement of the threshold voltage can be utilized to select a particular set of offset voltages to be utilized for subsequent read operations. In some embodiments, a first set of offset voltages that are greater than the first threshold voltage can be selected when the quantity of bits is greater than the first threshold and a second set of offset voltages that are less than the first threshold voltage can be selected when the quantity of bits is less than the second threshold. In some embodiments, a third set of offset voltages can include a portion of voltages that are greater than the first threshold voltage and a portion of voltages that are less than the first threshold voltage when the quantity of bits is between the first threshold quantity of bits and the second threshold quantity of bits. In some embodiments, the error recovery operation can revert to a previous set of offset voltages to test when the determined quantity of bits is between the first threshold quantity of bits and the second threshold quantity of bits.

The memory sub-system voltage threshold prediction-based memory management component 113 can be configured to determine a second threshold voltage to be utilized for a second read operation based on a comparison between the determined quantity of bits and the first and second threshold quantity of bits. As described herein, the determined quantity of bits from the first read operation can be compared to the first threshold quantity of bits and the second threshold quantity of bits. As described herein, the first threshold voltage can be altered to the second threshold voltage based on the comparison. For example, the second threshold voltage can be greater than the first threshold voltage when the comparison identifies that the quantity of bits is greater than the first threshold quantity of bits. In a different example, the second threshold voltage can be less than the first threshold voltage when the comparison identifies that the quantity of bits is less than the second threshold quantity of bits. In this way, the second threshold voltage can be altered to a voltage that is determined to be closer to a threshold voltage that can be utilized to decode the set of memory cells. In addition, subsequent threshold voltages that are less likely to be utilized to decode the set of memory cells can be avoided or not used to perform read operations.

The memory sub-system voltage threshold prediction-based memory management component 113 can be configured to perform the second read operation using the second threshold voltage. In some embodiments, the second threshold voltage can be a first offset voltage that is utilized during the error recovery operation. As described herein, the subsequent offset voltages can be selected based on the comparison between the quantity of bits determined using the first read operation. That is, subsequent offset voltages can be selected that are greater than the first threshold voltage when the quantity of bits is greater than the first threshold quantity of bits and the subsequent offset voltages can be selected that are less than the first threshold voltage when the quantity of bits is less than the second threshold quantity of bits. This avoids using offset voltages that move away from a particular threshold voltage relative to the first threshold voltage. In some embodiments, the second threshold voltage is greater than the first threshold voltage when the determined quantity of bits is greater than the first threshold quantity of bits. In other embodiments, the second threshold voltage is less than the first threshold voltage when the determined quantity of bits is less than the second threshold quantity of bits.

In some embodiments, the voltage threshold prediction-based memory management component 113 can be configured to perform the second read operation using the second threshold voltage that is greater than the first threshold voltage and perform a third read operation using a third threshold voltage that is less than the first threshold voltage when the determined quantity of bits is between the first and second threshold quantity of bits. In some embodiments, a determined quantity of bits from the first read operation that is between the first threshold and the second threshold quantity of bits can indicate that the threshold value or voltage to decode the set of memory cells is relatively close to the voltage of the first threshold voltage. In these embodiments, a set of offsets can be selected that are relatively close to the first threshold voltage. For example, a second threshold voltage that is greater than the first threshold voltage can be selected and a third threshold voltage that is less than the first threshold voltage can be selected.

In some embodiments, the voltage threshold prediction-based memory management component 113 can be configured to determine a plurality of subsequent threshold voltages to be greater than the first threshold voltage when the determined quantity of bits is greater than the first threshold quantity of bits. As described herein, only offset voltages that are greater than the first threshold voltage can be utilized when it is determined that the threshold voltage or voltage to be selected as the threshold voltage is greater than the first threshold voltage. In this way, offset voltages that are likely not going to decode the set of memory cells can be avoided, which can save time and computing resources.

In some embodiments, the voltage threshold prediction-based memory management component 113 can be configured to determine a plurality of subsequent threshold voltages to be less than the first threshold voltage when the determined quantity of bits is less than the second threshold quantity of bits. In a similar way, only offset voltages that are less than the first threshold voltage can be utilized when it is determined that the threshold voltage or voltage to be selected as the threshold voltage is less than the first threshold voltage. In this way, offset voltages that are likely not going to decode the set of memory cells can be avoided, which can save time and computing resources.

In some embodiments, the voltage threshold prediction-based memory management component 113 can be configured to perform only positive read offsets when the determined quantity of bits is greater than the first threshold quantity of bits and perform only negative read offsets when the determined quantity of bits is less than the second threshold quantity of bits. As used herein, a positive read offset can include an altered voltage from a particular voltage in a positive direction (e.g., increase in voltage from a first voltage). In a similar way, a negative read offset can include an altered voltage from a particular voltage in a negative direction (e.g., decrease in voltage from a first voltage).

Figure 2:
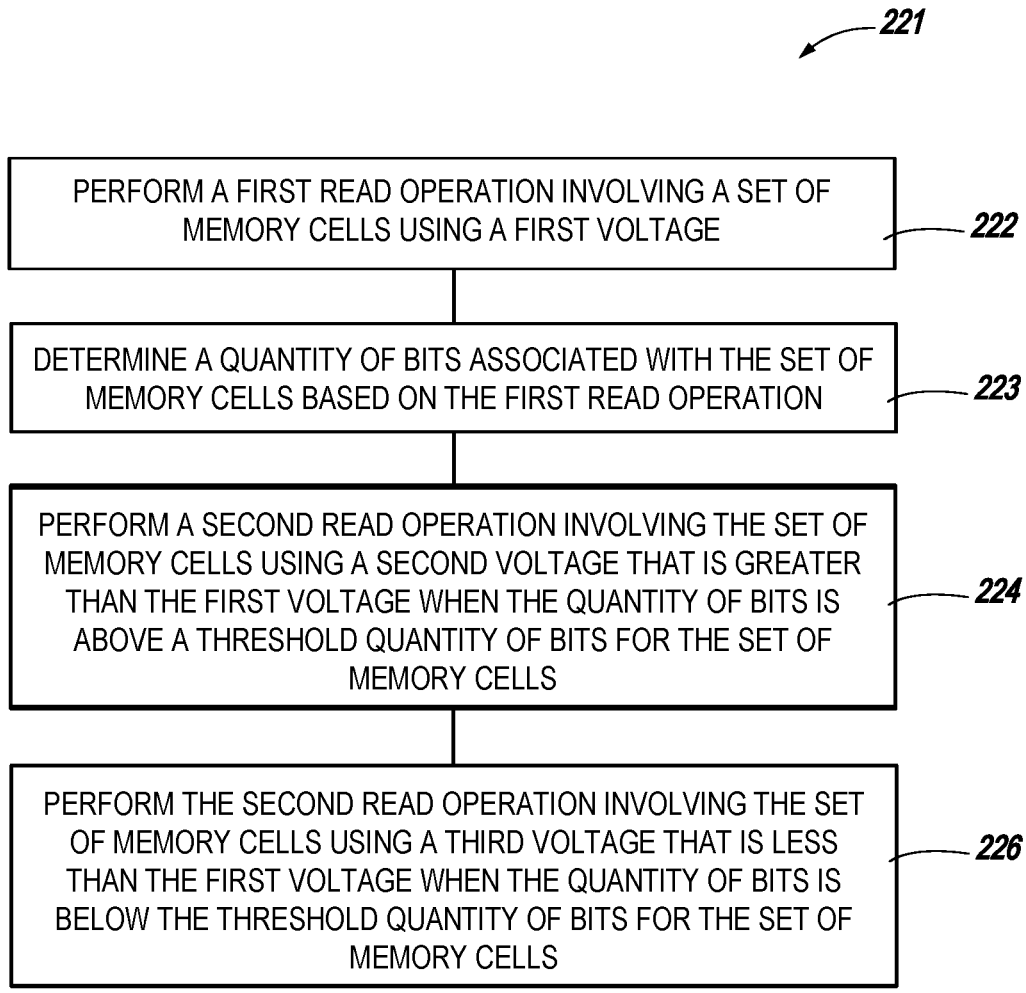
FIG. 2 is a flow diagram corresponding to a method for voltage threshold prediction-based memory management in accordance with some embodiments of the present disclosure.

FIG. 2 is a flow diagram corresponding to a method 221 for voltage threshold prediction-based memory management in accordance with some embodiments of the present disclosure. The method 221 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 221 is performed by the voltage threshold prediction-based memory management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As described herein, the set of memory cells can be degraded or altered after time and/or use. In some embodiments, a threshold voltage used to decode the set of memory cells can shift to different voltages through this degradation. An error recovery operation can be utilized when the set of memory cells were degraded or altered after a period of time. In some approaches, when the error recovery operation is initiated, a plurality of offset voltages would be tested in a positive direction and negative direction to determine a voltage that could be used as an updated threshold voltage. As described herein, performing a plurality of reads utilizing alternating positive and negative offset voltages can be time and resource intensive. Thus, the method 221 can utilize a single read operation to predict whether positive or negative offsets should be used. In this way, approximately half of the processes can be utilized to find the updated threshold voltage for the set of memory cells.

At operation 222, a first read operation involving a set of memory cells using a first voltage can be performed. In some embodiments, the first threshold voltage can be a threshold voltage that is defined for the set of memory cells through parameters or other settings. In some embodiments, the first threshold voltage can target a particular location or memory cell of the set of memory cells. In these embodiments, a predicted quantity of bits can be determined based on the particular location or memory cell that is targeted by the first threshold voltage. For example, the predicted quantity of bits can be a quantity of bits that should be read if the first threshold voltage targets a correct location or memory cell of the set of memory cells. In this example, the correct location or memory cell can be the location or memory cell defined by the parameters of the set of memory cells utilizing the first threshold voltage.

At operation 223, a quantity of bits associated with the set of memory cells can be determined based on the first read operation. As described herein, the first read operation can be utilized to count or determine the quantity of bits of the set of memory cells. In some embodiments, the set of memory cells can include a first portion of memory cells that can be targeted by voltages that are greater than the first threshold voltage and a second portion of memory cells that can be targeted by voltages that are less than the first threshold voltage. In some embodiments, the first read operation can read one of the first portion of memory cells or the second portion of memory cells. In this way, the quantity of bits determined by the first read operation can identify whether the first threshold voltage should be increased or decreased by comparing the determined quantity of bits to threshold quantity of bits.

At operation 224, a second read operation involving the set of memory cells can be performed using a second voltage that is greater than the first voltage when the quantity of bits is above a threshold quantity of bits for the set of memory cells. In some embodiments, a determination is made that the threshold voltage for the set of memory cells has moved to a larger voltage than the first voltage when the quantity of bits is above the threshold quantity of bits. In other words, a voltage to target the read level for the set of memory cells may need to be greater than the first voltage. In these examples, the first voltage can be a voltage that was originally used to target the read level of the set of memory cells. In these examples, the threshold quantity of bits can be a designated quantity of bits that that exceeds a predicted quantity of bits for a read level of a read operation of the set of memory cells. That is, the threshold volage for the set of memory cells can target a particular read level of the set of memory cells and include a corresponding quantity of bits that can be read at the particular read level. A greater quantity of bits than the corresponding quantity of bits that can be read at the particular read level can indicate the threshold voltage for the set of memory cells is greater than the first voltage. This can indicate that the threshold voltage to be utilized for the memory cells has shifted to a more positive voltage than the first voltage or that the first voltage is targeting a cell that is toward a negative direction of the set of memory cells.

As described herein, previous approaches would determine that the threshold voltage has shifted and utilize various offset voltages that are greater than the previous voltage and voltages that are less than the previous voltage to determine a voltage that decodes the set of memory cells and identify the voltage as an updated threshold voltage or as a threshold voltage for the set of memory cells. These previous approaches can be more time consuming and consume a greater quantity of resources compared to predicting an offset direction of the threshold voltage based on a quantity of bits read at the particular read level of the set of memory cells. That is, in some embodiments, the predicted direction of the threshold voltage compared to the first voltage can allow the voltage threshold prediction-based memory management component 113 to utilize either positive offsets or negative offsets instead of having to utilize both positive and negative offsets.

In some embodiments, the method 221 can include operations to refrain from using the second voltage when the quantity of bits is below the threshold quantity of bits for the set of memory cells. In some embodiments, refraining from using the second voltage when the quantity of bits is below the threshold quantity of bits for the memory cell can include not using voltage offsets that are greater than the first voltage and/or the second voltage. That is, the method 221 can include operations to refrain from testing or utilizing offset voltages that are greater than the first voltage when the quantity of bits is below the threshold quantity of bits and since, in this example, the second voltage is greater than the first voltage, the method 221 can include operations to refrain from using the second voltage.

At operation 226, the second read operation involving the set of memory cells can be performed using a third voltage that is less than the first voltage when the quantity of bits is below the threshold quantity of bits for the set of memory cells. As described herein, the threshold quantity of bits for the set of memory cells can be based on a read level of the first voltage such that a quantity of read bits below the threshold quantity of bits for the set of memory cells can indicate that the threshold voltage has moved to a lower voltage than the first voltage. In this way, the method 221 can include operations to perform the second read operation using the third voltage instead of the second voltage when the quantity of bits is below the threshold quantity of bits when using the first voltage.

In some embodiments, the method 221 can include operations to refrain from using the third voltage when the quantity of bits is above the threshold quantity of bits for the set of memory cells. As described herein, the method 221 can include operations to determine whether the threshold voltage for the set of memory cells has increased or decreased based on the read quantity of bits using the first voltage. When the quantity of bits is above the threshold quantity of bits, the method 221 can include operations to refrain from using the third voltage that is less than the first volage. In addition, the method 221 can include operations to refrain from using voltages that are less than the third voltage or voltages that are between the first voltage and the third voltage. In this way, the method 221 can utilize only positive voltage offsets from the first voltage when the determined threshold voltage is greater than the first voltage and utilize only negative voltage offsets when the determined threshold voltage is less than the first voltage.

In some embodiments, the method 221 can include operations to determine the threshold quantity of bits for the set of memory cells based on a particular memory cell or sub-set of memory cells that is targeted by the first voltage. In these embodiments, the particular memory cell or sub-set of memory cells is a particular physical location within the set of memory cells. As described herein, the threshold quantity of bits can be based on the particular the first voltage and/or the particular physical location within the set of memory cells that is targeted by the first voltage. For example, the first voltage can represent a first read level that targets a first location within the set of memory cells. In this example, a first plurality of read levels at a corresponding plurality of locations can exist that can be targeted by corresponding voltages that are greater than the first voltage. In addition, a second plurality of read levels at a corresponding plurality of locations can exist that can be targeted by corresponding voltages that are less than the first voltage. In this example, the read operation can read the first plurality of read levels and a threshold quantity of bits can be based on a quantity of bits that exist within the first plurality of read levels. In this way, the threshold quantity of bits can be utilized to determine if the voltage threshold is at the first voltage, if the voltage threshold has moved to a read level or targeted voltage within the first plurality of read levels or if the voltage threshold has moved to a read level or targeted voltage within the second plurality of read levels. In this way, offset voltages that target the first plurality of read levels can be used when the quantity of bits is less than the threshold quantity of bits and offset voltages that target the second plurality of read levels can be used when the quantity of bits exceeds the threshold quantity of bits.

In a non-limiting example, the threshold quantity of bits is 5/8 of the quantity of bits when the particular physical location is positioned between a first portion of bits that are approximately 3/8 of the set of memory cells and a second portion of bits that are approximately 5/8 of the set of memory cells. As described herein, the threshold quantity of bits can be based on the particular physical location that is targeted by the first voltage. In this specific example, the particular location can be positioned between a first portion that includes approximately 3/8 of a total quantity of bits for the set of memory cells and the second portion includes approximately 5/8 of the bits for the set of memory cells. In this way, a read operation can be performed on the second portion of the set of memory cells to determine the quantity of bits for the set of memory cells. If the determined quantity of bits is greater than 5/8, the threshold voltage has moved toward the first portion and if the determined quantity of bits is less than 5/8, the threshold voltage has moved toward the second portion. Thus, depending on the determined direction of the threshold voltage, offset voltages can be selected in either a positive direction or negative direction based on the quantity of bits read during the read operation.

Figure 3:
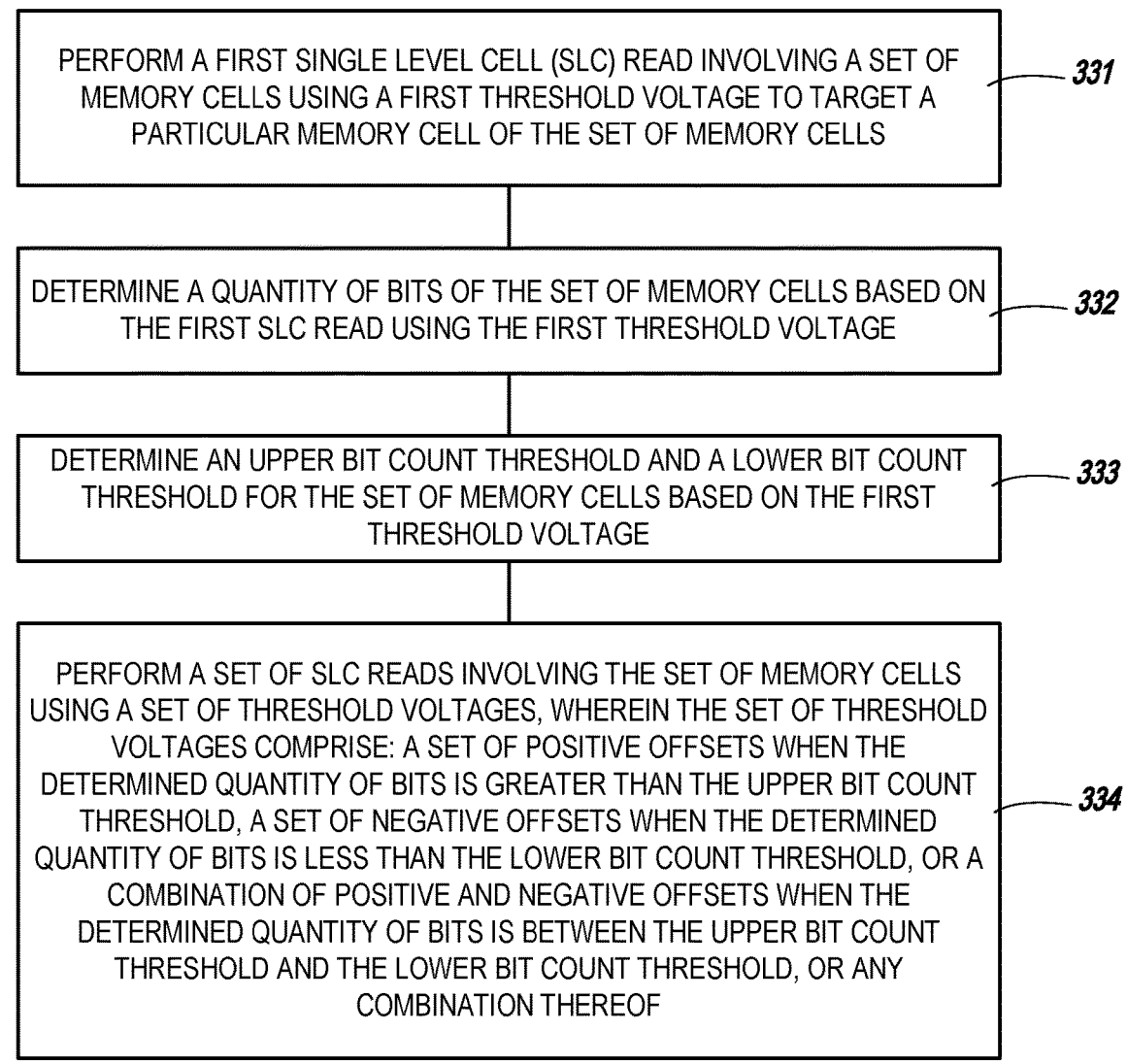
FIG. 3 is a flow diagram corresponding to a method for voltage threshold prediction-based memory management in accordance with some embodiments of the present disclosure.

FIG. 3 is a flow diagram corresponding to a method 330 for voltage threshold prediction-based memory management in accordance with some embodiments of the present disclosure. The method 330 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 330 is performed by the voltage threshold prediction-based memory management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As described herein, the set of memory cells can be degraded or altered after time and/or use. In some embodiments, a threshold voltage utilized to decode the set of memory cells can shift to different voltages through this degradation. An error recovery operation can be utilized when the set of memory cells were degraded or altered after a period of time. In some approaches, when the error recovery operation is initiated, a plurality of offset voltages would be tested in a positive direction and negative direction to determine a voltage that could be used as an updated threshold voltage. As described herein, performing a plurality of reads utilizing alternating positive and negative offset voltages can be time and resource intensive. Thus, the method 330 can utilize a single read operation to predict whether positive or negative offsets should be used. In this way, approximately half of the processes can be utilized to find the updated threshold voltage for the set of memory cells.

At operation 331, a first single level cell (SLC) read involving a set of memory cells can be performed using a first threshold voltage to target a particular memory cell of the set of memory cells. As described herein, the first SLC read can read a portion of the set of memory cells in a single direction from the particular memory cell of the set of memory cells. In some embodiments, the first SLC read can be utilized to determine a quantity of bits associated with the portion of the set of memory cells.

At operation 332, a quantity of bits of the set of memory cells can be determined based on the first SLC read using the first threshold voltage. As described herein, the first SLC read can be used to determine a quantity of bits associated with the set of memory cells and/or a particular portion of the set of memory cells. As described herein, the first threshold voltage can be a voltage that was defined by parameters of the set of memory cells. In some embodiments, the defined parameters can also include the particular memory cell from the set of memory cells that is targeted when using the first threshold voltage for the first SLC read.

In some embodiments, the quantity of bits comprise a quantity of bits at a physical location targeted by positive offsets from the particular memory cell targeted by the first threshold voltage. For example, the quantity of bits includes bits associated with cells from the set of memory cells that are targeted by the first threshold voltage and bits associated with cells in a particular direction such that positive offsets would target bits in the particular direction. As described herein, the particular memory cell targeted by the first threshold voltage can include a first proximate portion of cells and a second proximate portion of cells. In some embodiments, the quantity of bits can be associated with one of the first proximate portion or the second proximate portion.

At operation 333, an upper bit count threshold and a lower bit count threshold can be determined for the set of memory cells based on the first threshold voltage. As described herein, a predicted quantity of bits to be read using the first threshold voltage can be used to determine the upper bit count threshold and the lower bit count threshold. In some embodiments, the upper bit count threshold can be a quantity of bits that can indicate the first threshold voltage is lower than a threshold voltage that can decode the set of memory cells and the lower bit count threshold can be a quantity of bits that can indicate the first threshold voltage is greater than the threshold voltage that can decode the set of memory cells. In this way, the upper bit count threshold and the lower bit count threshold can be utilized to identify a shift in the threshold voltage that can decode the set of memory cells and/or utilized to identify offset voltages to test for subsequent read operations.

At operation 334, a set of SLC reads involving the set of memory cells can be performed using a set of threshold voltages, wherein the set of threshold voltages comprise: a set of positive offsets when the determined quantity of bits is greater than the upper bit count threshold, a set of negative offsets when the determined quantity of bits is less than the lower bit count threshold, or a combination of positive and negative offsets when the determined quantity of bits is between the upper bit count threshold and the lower bit count threshold, or any combination thereof. As described herein, the set of positive offsets can be a set of threshold voltages that are greater than the first threshold voltage and the set of negative offsets can be a set of threshold voltages that are less than the first threshold voltage.

In some embodiments, the method 330 can include operations to refrain from using negative offsets when the determined quantity of bits is greater than the upper bit count threshold. That is, the set of positive offsets will include only offset voltages that are greater than the first threshold voltage when the determined quantity of bits is greater than the upper bit count threshold. In some embodiments, the method 330 can include operations to refrain from using positive offsets when the determined quantity of bits is less than the lower bit count threshold. That is, the set of negative offsets will include only offset voltages that are less than the first threshold voltage when the determined quantity of bits is less than the lower bit count threshold.

In some embodiments, the method 330 can include operations to alter the upper bit count threshold and the lower bit count threshold based on the designated read level. In these embodiments, the upper bit count threshold and the lower bit count threshold are increased when the threshold voltage is lowered and the upper bit count threshold and the lower bit count threshold are decreased when the threshold voltage is increased. As described herein, the upper bit count threshold and/or the lower bit count threshold can be determined based on a read level of the first threshold voltage. For example, the first threshold voltage can target a particular physical location or physical memory cell of the set of memory cells. In this example, the upper bit count and/or lower bit count can be based on a predicted quantity of bits to be read if the first threshold voltage is an acceptable threshold voltage for the set of memory cells. As used herein, an acceptable threshold voltage for a set of memory cells generally refers to a threshold voltage that can decode the set of memory cells.

Figure 4:
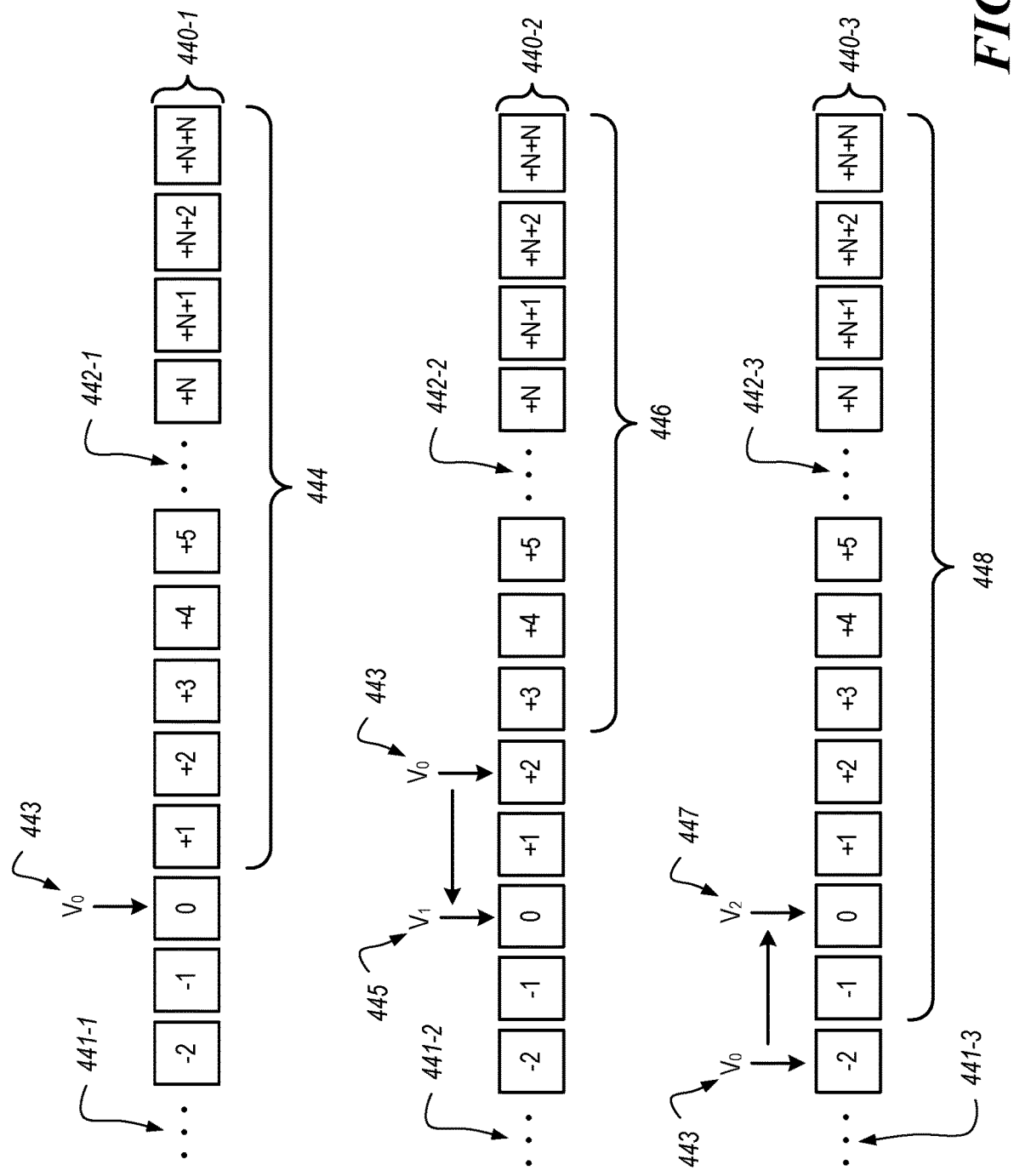
FIG. 4 illustrates an example of voltage threshold prediction for a set of memory cells in accordance with some embodiments of the present disclosure.

FIG. 4 illustrate an example of voltage threshold prediction for a set of memory cells 440-1, 440-2, 440-3, in accordance with some embodiments of the present disclosure. In some embodiments, the set of memory cells 440-1 can illustrate a set of memory cells 440-1 with a first threshold voltage 443 that is capable of decoding the set of memory cells 440-1 at the particular location (e.g., cell 0). Although a plurality of cells are illustrated in FIG. 4, a plurality of additional memory cells can be added. For example, a plurality of memory cells 441-1 can be positioned on a negative side of cell 0 and a plurality of memory cells 442-2 can be positioned on the positive side of cell 0. As used herein, a negative side of cell 0 can indicate that a lower voltage than the first threshold voltage 443 would be used to target cells on the negative side of cell 0. In a similar way, a positive side of cell 0 can indicate that a higher voltage than the first threshold voltage 443 would be used to target cells on the positive side of cell 0.

In some embodiments, a read operation can be performed utilizing the first threshold voltage 443. In these embodiments, the read operation can be a single level read operation to read the positive side of cell 0. In this example, the read operation can determine a quantity of bits 444 associated with the set of memory cells 440-1. In some embodiments, the quantity of bits 444 can correspond to a correct quantity of bits when the first threshold voltage 443 is capable of decoding the set of memory cells 440-1. That is, the quantity of bits 444 can include a quantity of bits that are determined when the set of memory cells 440-1 are programmed and the first threshold voltage 443 targets the location of cell 0. In some embodiments, the quantity of bits 444 can be utilized to determine an upper threshold of bits and/or a lower threshold of bits. As described herein, the threshold quantity of bits can be utilized to identify a direction that the first threshold voltage 443 has shifted.

As described herein, the set of memory cells 440-1 can be degraded or altered after time and/or use. In some embodiments, the first threshold voltage 443 utilized to decode the set of memory cells 440-1 can shift to different voltages through this degradation. In some embodiments, the set of memory cells 440-2 can represent a first degradation and the set of memory cells 440-3 can represent a second degradation of the set of memory cells 440-1. The set of memory cells 440-2 and the set of memory cells 440-3 can include the same or similar set of memory cells. For example, the set of memory cells 440-2 can include an additional plurality of memory cells 441-2 in a negative direction and an additional plurality of memory cells 442-2 in a positive direction. Similarly, the set of memory cells 440-3 can include an additional plurality of memory cells 441-3 in a negative direction and an additional plurality of memory cells 442-3 in a positive direction.

As illustrated by the set of memory cells 440-2, the first threshold voltage 443 has shifted from cell 0 to cell +2. This can occur over a period of time or use as described herein. In some embodiments, the first threshold voltage 443 can be used to perform a read operation on the set of memory cells 440-2. As described herein, the read operation can be utilized to determine a quantity of bits 446 for the set of memory cells 440-2. In some embodiments, the quantity of bits 446 can be less than the quantity of bits 444. In some embodiments, the quantity of bits 446 can be less than the determined lower threshold of bits as described herein. In these embodiments, the quantity of bits 446 can include bit +2, the plurality of bits 442-2, and bits through bit +N+N.

As described herein, the quantity of bits 446 will be less than the quantity of bits 444 from the set of memory cells 440-1. In this way, a voltage threshold prediction-based memory management component (e.g., voltage threshold prediction-based memory management component 113 as illustrated in FIG. 1, etc.) can determine that the first threshold voltage 443 has moved in the positive direction and that the threshold voltage is to be lower than the first threshold voltage 443. For example, the first threshold voltage 443 can be lowered to a second threshold voltage 445. In this example, the lower second threshold voltage 445 can target the cell 0 and result in decoding the set of memory cells 440-2.

As illustrated by the set of memory cells 440-3, the first threshold voltage 443 has shifted from cell 0 to cell −2. This can occur over a period of time or use as described herein. In some embodiments, the first threshold voltage 443 can be used to perform a read operation on the set of memory cells 440-3. As described herein, the read operation can be utilized to determine a quantity of bits 448 for the set of memory cells 440-3. In some embodiments, the quantity of bits 448 can be greater than the quantity of bits 444. In some embodiments, the quantity of bits 448 can be greater than the determined upper threshold of bits as described herein. In these embodiments, the quantity of bits 448 can include bit −2, the plurality of bits 442-3, and bits through bit +N+N.

As described herein, the quantity of bits 448 will be greater than the quantity of bits 444 from the set of memory cells 440-1. In this way, a voltage threshold prediction-based memory management component (e.g., voltage threshold prediction-based memory management component 113 as illustrated in FIG. 1, etc.) can determine that the first threshold voltage 443 has moved in the negative direction and that the threshold voltage is to be greater than the first threshold voltage 443. For example, the first threshold voltage 443 can be increased to a third threshold voltage 447. In this example, the greater third threshold voltage 447 can target the cell 0 and result in decoding the set of memory cells 440-3.

Figure 5:
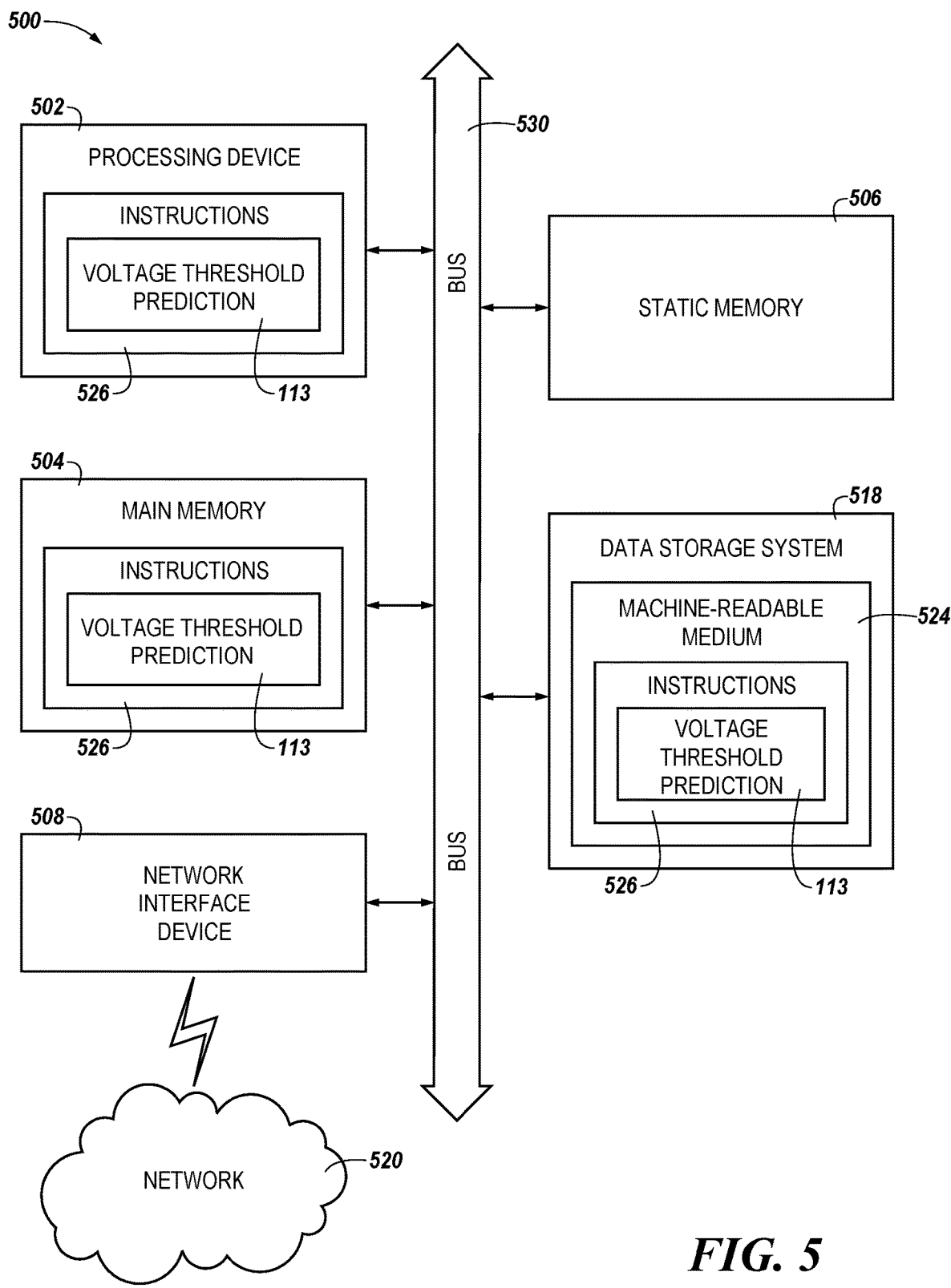
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the voltage threshold prediction-based memory management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a voltage threshold prediction-based memory management component (e.g., the voltage threshold prediction-based memory management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
performing a first read operation involving a set of memory cells using a first voltage;
determining a quantity of bits associated with the set of memory cells based on the first read operation;
predicting a shift in a voltage threshold associated with the set of memory cells based on performance of the first read operation and the determined quantity of bits associated with the set of memory cells based on the first read operation;
performing a second read operation involving the set of memory cells using a second voltage that is greater than the first voltage in response to determining that the quantity of bits is above a threshold quantity of bits for the set of memory cells based on the predicted shift in the voltage associated with the set of memory cells; and
performing the second read operation involving the set of memory cells using a third voltage that is less than the first voltage in response to determining that the quantity of bits is below the threshold quantity of bits for the set of memory cells based on the predicted shift in the voltage associated with the set of memory cells.

2. The method of claim 1, further comprising refraining from using the second voltage in response to determining that the quantity of bits is below the threshold quantity of bits for the set of memory cells.

3. The method of claim 1, further comprising refraining from using the third voltage in response to determining that the quantity of bits is above the threshold quantity of bits for the set of memory cells.

4. The method of claim 1, wherein the set of memory cells comprise a word line of a NAND memory device.

5. The method of claim 1, comprising determining the threshold quantity of bits for the set of memory cells based on a particular memory cell or sub-set of memory cells that is targeted by the first voltage, wherein the particular memory cell or sub-set of memory cells is a particular physical location within the set of memory cells.

6. The method of claim 5, wherein the threshold quantity of bits is ⅝ of the quantity of bits in response to determining that the particular physical location is positioned between a first portion of bits that are ⅜ of the set of memory cells and a second portion of bits that are ⅝ of the set of memory cells.

7. An apparatus, comprising:
a voltage threshold prediction component configured to:
perform a first read operation involving a set of memory cells using a first threshold voltage that targets a particular memory cell from the set of memory cells;
determine a quantity of bits of the set of memory cells based on the first read operation using the first threshold voltage;
determine a first threshold quantity of bits for the set of memory cells based on the first threshold voltage;

determine a second threshold quantity of bits for the set of memory cells based on the first threshold voltage;

predict a shift in a voltage threshold associated with the set of memory cells based on performance of the first read operation using the first threshold voltage that targets the particular memory cell from the set of memory cells;

determine a second threshold voltage to be utilized for a second read operation based on a comparison between the determined quantity of bits and the first threshold quantity of bits and the second threshold quantity of bits and the predicted shift in the voltage associated with the set of memory cells based on performance of the first read operation using the first threshold voltage; and perform the second read operation using the second threshold voltage.

8. The apparatus of claim 7, wherein the second threshold voltage is greater than the first threshold voltage when the determined quantity of bits is greater than the first threshold quantity of bits.

9. The apparatus of claim 7, wherein the second threshold voltage is less than the first threshold voltage when the determined quantity of bits is less than the second threshold quantity of bits.

10. The apparatus of claim 7, wherein the voltage threshold prediction component is configured to perform the second read operation using the second threshold voltage that is greater than the first threshold voltage and perform a third read operation using a third threshold voltage that is less than the first threshold voltage when the determined quantity of bits is between the first threshold quantity of bits and the second threshold quantity of bits.

11. The apparatus of claim 7, wherein the voltage threshold prediction component is configured to determine a plurality of subsequent threshold voltages to be greater than the first threshold voltage when the determined quantity of bits is greater than the first threshold quantity of bits.

12. The apparatus of claim 7, wherein the voltage threshold prediction component is configured to determine a plurality of subsequent threshold voltages to be less than the first threshold voltage when the determined quantity of bits is less than the second threshold quantity of bits.

13. The apparatus of claim 7, wherein the voltage threshold prediction component is configured to perform only positive read offsets when the determined quantity of bits is greater than the first threshold quantity of bits and perform only negative read offsets when the determined quantity of bits is less than the second threshold quantity of bits.

14. A system, comprising:
a plurality of memory components arranged to form a stackable cross-gridded array of interleaved NAND memory cells; and
a processing device coupled to the plurality of memory components, the processing device to perform operations comprising:
performing a first single level cell (SLC) read involving a set of memory cells using a first threshold voltage to target a particular memory cell of the set of memory cells;

determining a quantity of bits of the set of memory cells based on the first SLC read using the first threshold voltage;

determining an upper bit count threshold and a lower bit count threshold for the set of memory cells based on the first threshold voltage;

predicting a shift in a voltage threshold associated with the set of memory cells based on performance of the first SLC read involving the set of memory cells using the first threshold voltage;

performing a first set of SLC reads involving the set of memory cells using a first set of threshold voltages based on the predicted shift in the voltage threshold associated with the set of memory cells based on performance of the first SLC read involving the set of memory cells using the first threshold voltage, wherein the set of threshold voltages comprise:
a set of positive offsets when the determined quantity of bits is greater than the upper bit count threshold;
a set of negative offsets when the determined quantity of bits is less than the lower bit count threshold; or
a combination of positive and negative offsets when the determined quantity of bits is between the upper bit count threshold and the lower bit count threshold, or any combination thereof; and determining a second set of threshold voltages to be utilized for a second set of SLC reads based on a comparison between the determined quantity of bits and the upper bit count threshold and the lower bit count threshold and the predicted shift in the voltage associated with the set of memory cells based on performance of the first set of SLC reads using the first set of threshold voltages.

15. The system of claim 14, wherein the processing device is to refrain from using negative offsets when the determined quantity of bits is greater than the upper bit count threshold.

16. The system of claim 14, wherein the processing device is to refrain from using positive offsets when the determined quantity of bits is less than the lower bit count threshold.

17. The system of claim 14, wherein the set of memory cells comprise a single word line of a NAND memory cell.

18. The system of claim 14, wherein the processing device is to alter the upper bit count threshold and the lower bit count threshold based on a designated read level.

19. The system of claim 18, wherein the upper bit count threshold and the lower bit count threshold are increased when the first threshold voltage is lowered to a second threshold voltage and the upper bit count threshold and the lower bit count threshold are decreased when the first threshold voltage is increased to a third threshold voltage.

20. The system of claim 14, wherein the quantity of bits comprise a quantity of bits at a physical location targeted by the positive offsets from the particular memory cell targeted by the first set of threshold voltages.

* * * * *